(12) United States Patent
Hong et al.

(10) Patent No.: US 8,847,653 B2
(45) Date of Patent: Sep. 30, 2014

(54) DITHER CONTROL CIRCUIT AND DEVICES HAVING THE SAME

(71) Applicant: Samsung Electronics Co., Ltd., Suwon-si (KR)

(72) Inventors: Jong Phil Hong, Hwaseong-si (KR); Jenlung Liu, Seoul (KR); Nan Xing, Yongin-si (KR); Jae Jin Park, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 7 days.

(21) Appl. No.: 13/737,337

(22) Filed: Jan. 9, 2013

(65) Prior Publication Data

US 2013/0187685 A1    Jul. 25, 2013

(30) Foreign Application Priority Data

Jan. 25, 2012  (KR) .......................... 10-2012-0007129

(51) Int. Cl.
  *G06F 1/04* (2006.01)
  *H03L 7/00* (2006.01)
  *H03B 19/00* (2006.01)

(52) U.S. Cl.
  CPC . *H03B 19/00* (2013.01); *H03L 7/00* (2013.01)
  USPC .............. 327/291; 327/159; 327/298; 331/17

(58) Field of Classification Search
  None
  See application file for complete search history.

(56) References Cited

U.S. PATENT DOCUMENTS

| 6,670,854 | B2 * | 12/2003 | Takeda et al. ................. 331/1 A |
| 7,385,539 | B2 * | 6/2008 | Vanselow et al. ............. 341/143 |
| 7,750,742 | B2 | 7/2010 | Cho et al. |
| 7,920,081 | B2 | 4/2011 | Waheed et al. |
| 8,428,102 | B2 * | 4/2013 | Chester et al. ................ 375/141 |
| 2006/0123072 | A1 * | 6/2006 | Onaya et al. ................. 708/250 |
| 2009/0302951 | A1 | 12/2009 | Ballantyne |
| 2011/0095830 | A1 | 4/2011 | Tsangaropoulos et al. |

FOREIGN PATENT DOCUMENTS

| KR | 10-2009-0066389 A | 6/2009 |
| KR | 10-2011-0027773 A | 3/2011 |

* cited by examiner

*Primary Examiner* — An Luu
(74) *Attorney, Agent, or Firm* — Myers Bigel Sibley & Sajovec, PA

(57) ABSTRACT

A dither control circuit includes a pseudo random number generator, which generates a pseudo random number sequence in response to a frequency-divided clock signal, and a dither circuit which dithers an input digital code by using at least one output bit of the pseudo random number sequence and outputs a dithered digital code corresponding to a result of the dithering. The dither circuit may output, as the dithered digital code, a digital code corresponding to a sum of or a difference between the input digital code and the input digital code based on the at least one output bit. The dithered digital code may be input to an accumulator which operates in-sync with the frequency-divided clock signal.

14 Claims, 14 Drawing Sheets

DITHER CONTROL CIRCUIT AND DEVICES HAVING THE SAME

REFERENCE TO PRIORITY APPLICATION

This application claims priority under 35 U.S.C. §119(a) from Korean Patent Application No. 10-2012-0007129 filed on Jan. 25, 2012, the disclosure of which is hereby incorporated herein by reference in its entirety.

FIELD

This invention relates to integrated circuit devices and, more particularly, to dither control circuits and methods of operating same.

BACKGROUND

Various types of communication systems or signal processing systems include a phase locked loop (PLL) for generating a clock signal. PLLs are control systems that generates an output signal having a phase associated with a phase of an input reference signal. In general, PLLs include a phase comparator, a low pass filter (LPF), and a voltage controlled oscillator (VCO). The phase comparator compares the phase of the input reference signal with the phase of a feedback signal fed back from the voltage controlled oscillator, and generates a phase error signal corresponding to a result of the comparison. The LPF removes a high frequency component from the phase error signal to generate a control voltage. The VCO generates the feedback signal having a frequency which is controlled based on the control voltage.

SUMMARY

According to an embodiment of the present inventive concept, there is provided a dither control circuit including a pseudo random number generator, which generates a pseudo random number sequence in response to a frequency-divided clock signal, and a dither circuit, which dithers an input digital code by using at least one output bit of the pseudo random number sequence and outputs a dithered digital code corresponding to a result of the dithering. The dither circuit outputs a digital code corresponding to a sum of or a difference between the input digital code and the input digital code based on the at least one output bit.

According to another embodiment of the inventive concept, the pseudo random number generator includes a linear feedback shift register, which generates the pseudo random number sequence in response to the frequency-divided clock signal, and a bit inversion control circuit, which inverts and outputs the at least one output bit per period of the linear feedback shift register. The pseudo random number generator may include a linear feedback shift register (LFSR), which generates the pseudo random number sequence in response to the frequency-divided clock signal, and a bit inversion control circuit, which inverts and outputs a single bit per period of the LFSR when the at least one output bit is the single bit. The bit inversion control circuit may include a comparator, which compares a seed and the pseudo random number sequence of the LFSR in units of bits to generate a comparison signal, a selection signal generation circuit, which outputs a selection signal in response to the comparison signal, an inverter, which inverts the single bit, and a selection circuit, which outputs the single bit or an inverted bit generated by the inverter as the output bit in response to the selection signal.

According to another embodiment of the present inventive concept, there is provided a clock signal generation circuit containing a dither control circuit, which dithers a first digital code by using a frequency-divided clock signal and outputs a dithered digital code, an accumulator, which accumulates the dithered digital code by using the frequency-divided clock signal and outputs an overflow bit, a digitally controlled oscillator (DCO), which generates a DCO output signal having a tuned frequency in response to a second digital code and the overflow bit, and a frequency divider, which divides the tuned frequency and outputs the frequency-divided clock signal having a divided frequency.

The dither control circuit includes a pseudo random number generator, which generates a pseudo random number sequence in response to the frequency-divided clock signal, and a dither circuit, which dithers the first digital code by using at least one output bit of the pseudo random number sequence and outputs a dithered digital code. The dither circuit outputs, as the dithered digital code, a digital code corresponding to a sum of or a difference between the first digital code and the first digital code according to the at least one output bit.

The pseudo random number generator may include a linear feedback shift register (LFSR), which generates the pseudo random number sequence in response to the frequency-divided clock signal, and a bit inversion control circuit, which inverts and outputs the at least one output bit per period of the LFSR.

The frequency divider may be a dual-modulus prescaler that divides the tuned frequency by a first or second frequency division factor and generates the frequency-divided clock signal having a divided frequency. According to another embodiment of the present inventive concept, there is provided a clock signal generation circuit containing an accumulator, which accumulates a first digital code by using a frequency-divided clock signal and outputs an overflow bit, a pseudo random number generator, which generates a pseudo random number sequence by using the frequency-divided clock signal, a digitally controlled oscillator (DCO), which generates a DCO output signal having a tuned frequency based on at least one output bit of the pseudo random number sequence, a second digital code, and the overflow bit, and a frequency divider, which divides the tuned frequency and generates the frequency-divided clock signal having a divided frequency.

According to another embodiment of the present inventive concept, there is provided a signal processing device containing a signal processing circuit, which processes a signal, and a clock signal generation circuit, which supplies a digitally controlled oscillator (DCO) output signal to the signal processing circuit. The clock signal generation circuit may include a dither control circuit, which dithers a first digital code by using at least one output bit output from a pseudo random number generator operating in response to a frequency-divided clock signal and outputs a dithered digital code, an accumulator, which accumulates the dithered digital code by using the frequency-divided clock signal and outputs an overflow bit, a DCO, which generates the DCO output signal having a tuned frequency in response to a second digital code and the overflow bit, and a frequency divider, which divides the tuned frequency and outputs the frequency-divided clock signal having a divided frequency.

According to another aspect of the present inventive concept, there is provided a signal processing device comprising a signal processing circuit, which processes a signal, and a clock signal generation circuit, which supplies a digitally controlled oscillator (DCO) output signal to the signal processing circuit.

The clock signal generation circuit includes an accumulator, which accumulates a first digital code by using a frequency-divided clock signal and outputs an overflow bit, a pseudo random number generator, which generates a pseudo random number sequence by using the frequency-divided clock signal, a DCO that generates the DCO output signal having a tuned frequency based on at least one output bit of the pseudo random number sequence, a second digital code, and the overflow bit, and a frequency divider that divides the tuned frequency and outputs the frequency-divided clock signal having a divided frequency. The pseudo random number generator may include a LFSR, which generates the pseudo random number sequence by using the frequency-divided clock signal, and a bit inversion control circuit, which equally adjusts the numbers of first logics and second logics of the at least one output bit during two adjacent periods of the LFSR.

According to an additional embodiment of the invention, there is provided a portable device including a signal processing circuit which processes a signal, a display module, which displays a processed signal output from the signal processing circuit, and a clock signal generation circuit that supplies a digitally controlled oscillator (DCO) output signal to the signal processing circuit. The clock signal generation circuit can include a dither control circuit, which dithers a first digital code by using at least one output bit output from a pseudo random number generator operating in response to a frequency-divided clock signal and outputs a dithered digital code, an accumulator, which accumulates the dithered digital code by using the frequency-divided clock signal and outputs an overflow bit, a DCO, which generates the DCO output signal having a tuned frequency in response to a second digital code and the overflow bit, and a frequency divider, which divides the tuned frequency and outputs the frequency-divided clock signal having a divided frequency.

BRIEF DESCRIPTION OF THE DRAWINGS

Exemplary embodiments of the present inventive concept will be more clearly understood from the following detailed description taken in conjunction with the accompanying drawings in which.

DETAILED DESCRIPTION

A dither control circuit according to an embodiment of the present inventive concept may dither an input digital code by using at least one output bit of a pseudo random number generator (PRNG). A clock signal generation circuit according to an embodiment of the present inventive concept including the dither control circuit may include an accumulator for increasing a frequency resolution of a digitally controlled oscillator (DCO).

In another embodiment of the present inventive concept, the clock signal generation circuit may further include a PRNG capable of removing spurious components that are generated according to a periodic operation of the accumulator. The spurious components are a general term for unnecessary frequency components other than a target frequency in communication systems or signal processing systems.

In another embodiment of the present inventive concept, the clock signal generation circuit may further include a frequency divider or a dual-modulus prescaler which generates a frequency-divided clock signal to randomize an output signal of the accumulator and/or the PRNG. The clock signal generation circuit may be implemented in a small area because it does not include a high-order sigma delta modulation circuit. In addition, the clock signal generation circuit may obtain a good phase noise property and/or high jitter performance.

Figure 1:
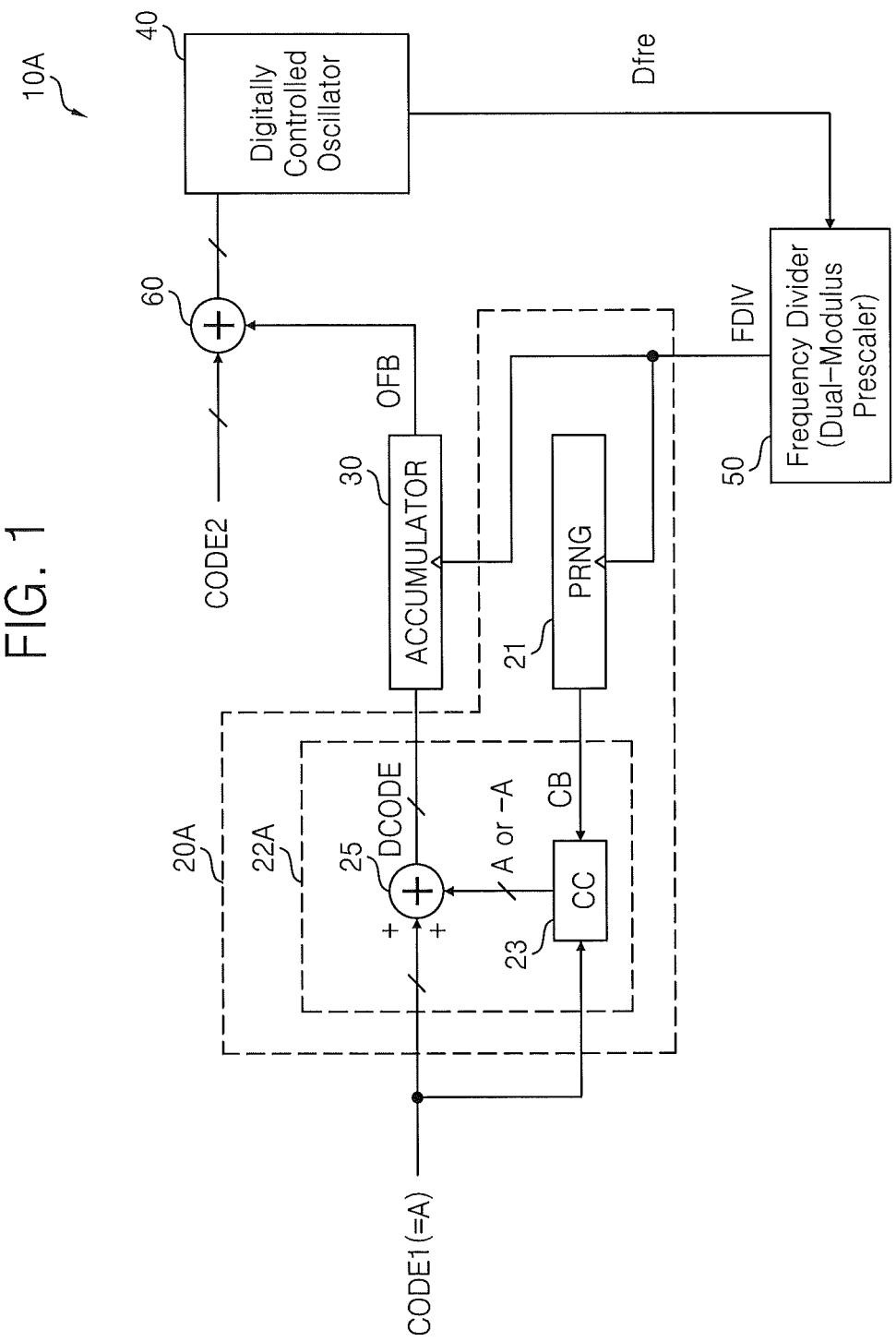
FIG. 1 is a block diagram of a clock signal generation circuit according to an embodiment of the present inventive concept.

FIG. 1 is a block diagram of a clock signal generation circuit 10A according to an embodiment of the present inventive concept. Referring to FIG. 1, the clock signal generation circuit 10A includes a dither control circuit 20A, an accumulator 30, a DCO 40, and a frequency divider 50. The dither control circuit 20A may dither a first digital code CODE1 by using a frequency-divided clock signal FDIV output from the frequency divider 50, and output a dithered digital code DCODE. Dither or dithering may denote an operation of changing the first digital code CODE1, or generating a digital code associated with the first digital code CODE1, or randomizing the first digital code CODE1 by using at least one output bit CB of a pseudo random number sequence generated by a PRNG.

The dither control circuit 20A includes a PRNG 21 and a dither circuit 22A. The PRNG 21 generates a pseudo random number sequence in response to the frequency-divided clock signal FDIV and outputs at least one output bit CB of the pseudo random number sequence. A structure and an operation of the PRNG 21 will be described in detail later with reference to FIGS. 3 through 5.

The dither circuit 22A may dither the first digital code CODE1 by using the at least one output bit CB of the pseudo random number sequence and output the dithered digital code DCODE to the accumulator 30. For example, the dither circuit 22A may output, as the dithered digital code DCODE, a digital code that corresponds to a sum of or a difference between a first digital code CODE1 and a first digital code CODE1 according to a logic (or a value), for example, logic "1" or "−1", of the at least one output bit CB. Although the logic (or value) of the output bit CB is defined as "1" or "−1" herein, the logic (or value) of the output bit CB may be defined as "1" or "0" in some cases. The dither circuit 22A includes a conversion circuit 23 and an operation circuit 25. The conversion circuit 23 may output a first digital code CODE1 (=A) or a first digital code CODE1 (=−A) having a negative sign, based on the first digital code CODE1 (=A) and the at least one output bit CB output from the PRNG 21.

Although a case where the output bit CB output from the PRNG 21 is 1-bit is illustrated hereinafter for convenience of explanation, the number of output bits CB output from the PRNG 21 is not limited thereto. When the output bit CB output from the PRNG 21 is one of logic 1 and logic −1, for example, logic 1, the conversion circuit 23 may output the digital code A having the same sign as the first digital code CODE1 (=A). However, when the output bit CB output from the PRNG 21 is the other logic, for example, logic −1, the conversion circuit 23 may output the digital code −A having an opposite sign to the first digital code CODE1 (=A).

The operation circuit 25 may output the dithered digital code DCODE corresponding to a sum of the first digital code CODE1 (=A) and the digital code A or −A output from the conversion circuit 23, that is, '2A' or '0', to the accumulator 30. Here, A or −A may be expressed as a decimal number. Accordingly, when the PRNG 21 sequentially outputs 1, −1, −1, and 1 as the output bit CB, the operation circuit 25 may sequentially output 2A, 0, 0, and 2A to the accumulator 30. In some embodiments, the operation circuit 25 may be implemented using an adder or a subtractor capable of outputting '2A' or '0'.

The accumulator 30 may accumulate the dithered digital code DCODE by using the frequency-divided clock signal FDIV and periodically output an overflow bit OFB according to a result of the accumulation. For example, the overflow bit OFB may be 1 bit. However, the number of overflow bits OFB output from the accumulator 30 is not limited thereto.

Figure 2:
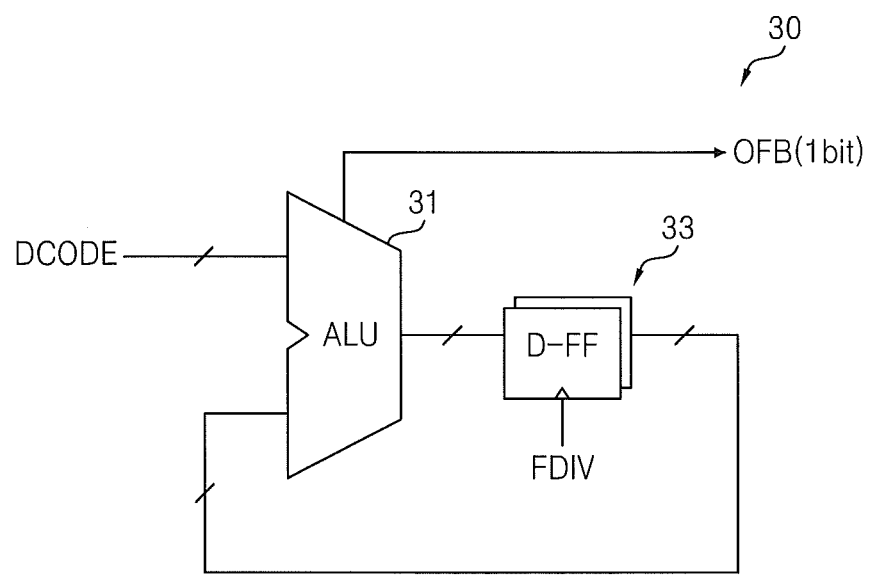
FIG. 2 is a block diagram of an accumulator illustrated in FIG. 1.
Figure 2:
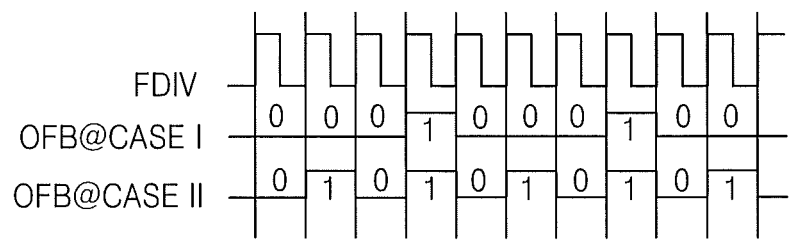

FIG. 2 is a block diagram of the accumulator 30. Referring to FIGS. 1 and 2, the accumulator 30 includes an arithmetic-logic unit (ALU) 31, and flip flops 33 that operate in response to the frequency-divided clock signal FDIV output from the frequency divider 50. The ALU 31 may add the dithered digital code DCODE and output bits of the flip flops 33 in units of bits and output a result of the addition to the flip flops 33. In addition, the ALU 31 may periodically output the overflow bit OFB generated according to the result of the addition.

Referring to CASE I, when the first digital code CODE1 is '001000(A=8)', the PRNG 21 sequentially outputs '1' as the output bit CB, and the dithered digital code DCODE is '010000(2A=16)', the ALU 31 may output the overflow bit OFB having logic 1 every four cycles (or periods) of the frequency-divided clock signal FDIV.

Referring to CASE II, when the first digital code CODE1 is '010000(A=16)', the PRNG 21 sequentially outputs '1' as the output bit CB, and the dithered digital code DCODE is '100000(2A=32)', the ALU 31 may output the overflow bit OFB having logic 1 every two cycles of the frequency-divided clock signal FDIV. The CASE I and the CASE II of FIG. 2 are examples illustrated for convenience of explanation. The DCO 40 of FIG. 1 may receive a second digital code CODE2 and the overflow bit OFB and tune the frequency of a DOC output signal Dfre based on the second digital code CODE2 and the overflow bit OFB to generate a DOC output signal Dfre having a tuned frequency.

As shown in FIG. 1, the clock signal generation circuit 10A may further include an adder 60. The adder 60 may add the second digital code CODE2 and the overflow bit OFB in units of bits and output a digital code corresponding to a result of the addition to the DCO 40. As described above, the second digital code CODE2 and the overflow bit OFB may be input directly to the DCO 40 or input to the DCO 40 via the adder 60.

The second digital code CODE2 may coarsely tune the frequency of the DCO 40, and the first digital code CODE1 may finely tune the frequency of the DCO 40 in time-average. Accordingly, the DCO 40 may tune a frequency of the DCO 40 by using the second digital code CODE2 and the overflow bit OFB to generate the DOC output signal Dfre having the tuned frequency.

The frequency of the DOC output signal Dfre is calculated using Equation 1:

$$D_{fre} = DEC(CODE2) * RES + \frac{DEC(CODE1)}{2^N} * RES \qquad \text{[Equation 1]}$$

where DEC(CODE2) indicates a decimal number corresponding to the second digital code CODE2, RES indicates a frequency resolution of the DCO 40, N indicates a bit-width of the ALU 31, and DEC(CODE1) indicates a decimal number corresponding to the first digital code CODE1.

For example, when the first digital code CODE1 is '010000 (=16)', the second digital code CODE2 is '00001000(=8)', the frequency resolution RES is 3 Mhz, and the ALU 31 is a 6-bit ALU, namely, N=6, the frequency of the DOC output signal Dfre is 24.75(=8*3+(16/64)*3) Mhz according to Equation 1. For example, an integer part, namely, 24, of 24.75 is determined based on the second digital code CODE2, and a decimal part, namely, 0.75, of 24.75 is determined based on the first digital code CODE1.

In the case I of FIG. 2, namely, when the first digital code CODE1 is '010000', overflow bits OFB of 0, 0, 0, and 1 are sequentially output every four cycles of the frequency-divided clock signal FDIV, and thus the adder 60 sequentially outputs '00001000(=8)', '00001000(=8)', '00001000(=8)', and '00001001(=9)'. Accordingly, since frequencies of the DOC output signal Dfre sequentially output every four cycles of the frequency-divided clock signal FDIV are 24 Mhz (=8*3), 24 Mhz, 24 Mhz, and 27 Mhz (=9*3), a 4-cycle average frequency is 24.75 Mhz.

For example, when the first digital code CODE1 is '100000 (=32)', the second digital code CODE2 is '00001000(=8)', the frequency resolution RES is 3 Mhz, and the ALU 31 is a 6-bit ALU, namely, N=6, the frequency of the DOC output signal Dfre is 25.5(=8*3+(32/64)*3) Mhz according to Equation 1.

In the case II of FIG. 2, namely, when the first digital code CODE1 is '100000', overflow bits OFB of 0 and 1 are sequentially output every two cycles of the frequency-divided clock signal FDIV, and thus the adder 60 sequentially outputs '00001000(=8)' and '00001001(=9)'. Accordingly, since frequencies of the DOC output signal Dfre sequentially output every two cycles of the frequency-divided clock signal FDIV are 24 Mhz (=8*3) and 27 Mhz (=9*3), a 2-cycle average frequency is 25.5 Mhz.

Each of the digital codes CODE1, CODE2, and DCODE described above includes 1 bit or more. The frequency divider 50 may divide the frequency of the DOC output signal Dfre output from the DCO 40 by a frequency division factor (or frequency division ratio), and output the frequency-divided clock signal FDIV having a divided frequency to the PRNG 21 and the accumulator 30. According to an embodiment, the frequency division factor may be programmed.

According to an embodiment, the frequency divider 50 may be implemented using a dual-modulus prescaler that divides the frequency of the DOC output signal Dfre by a first or second frequency division factor and generates a frequency-divided clock signal FDIV having a divided frequency. When the first frequency division factor is M (M is a natural number), the second frequency division factor is (M+1).

Figure 3:
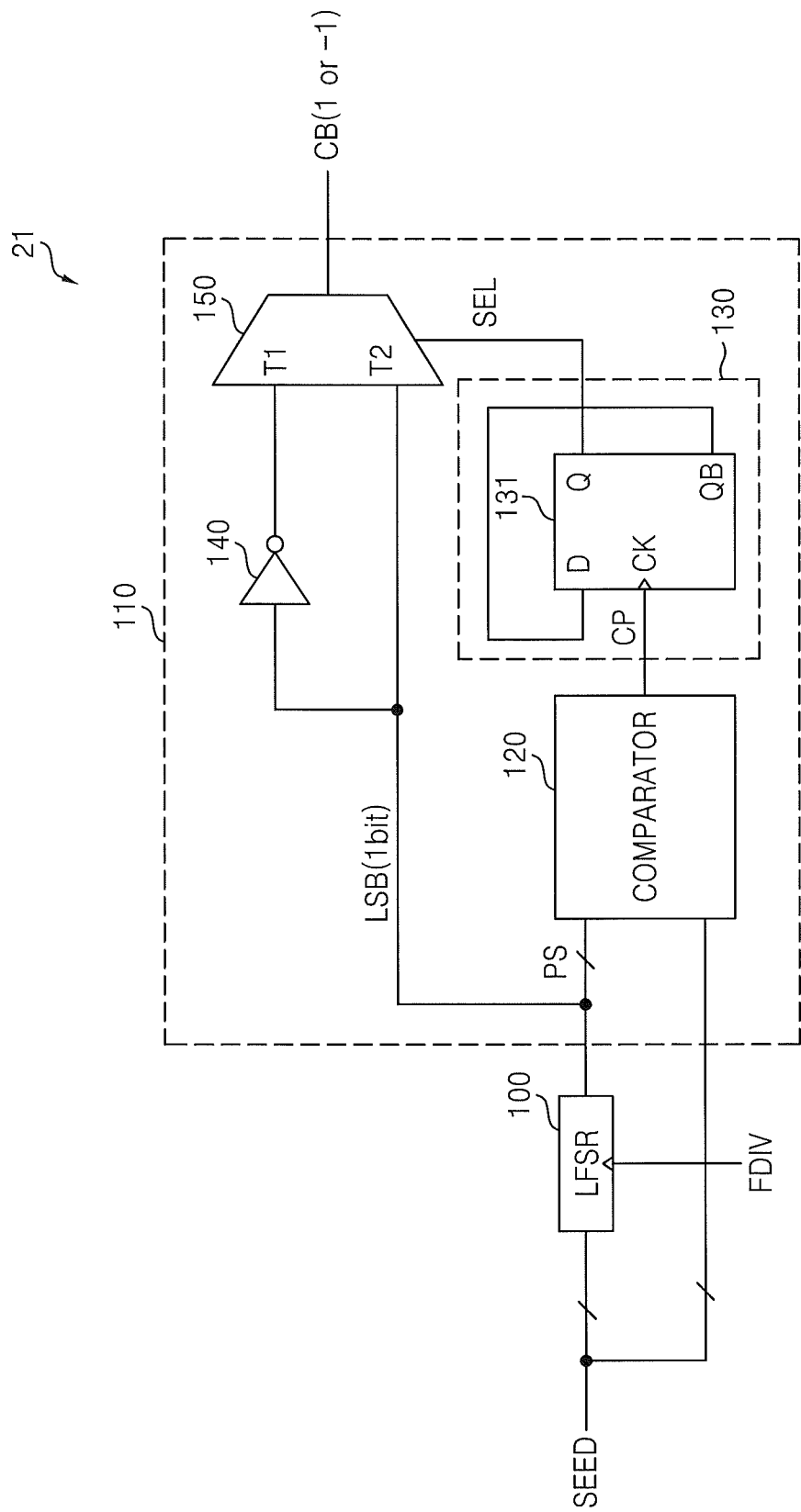
FIG. 3 is a block diagram of a pseudo random number generator (PRNG) illustrated in FIG. 1.
Figure 4:
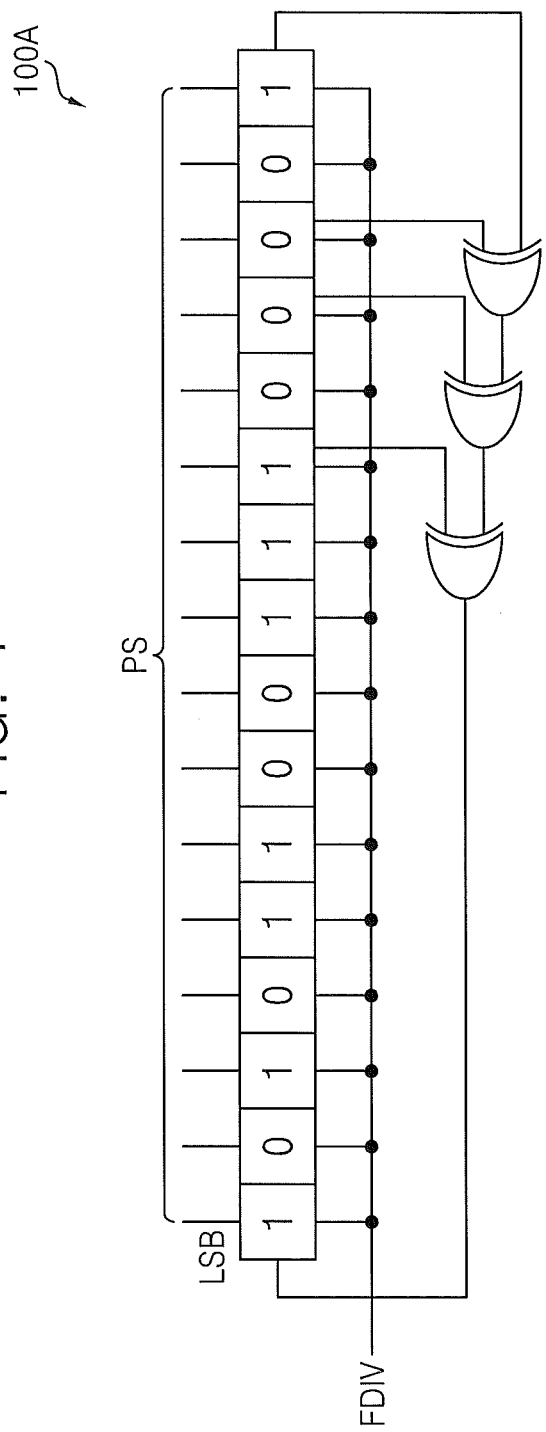
FIG. 4 illustrates an embodiment of a linear feedback shift register (LFSR) illustrated in FIG. 3.
Figure 5:
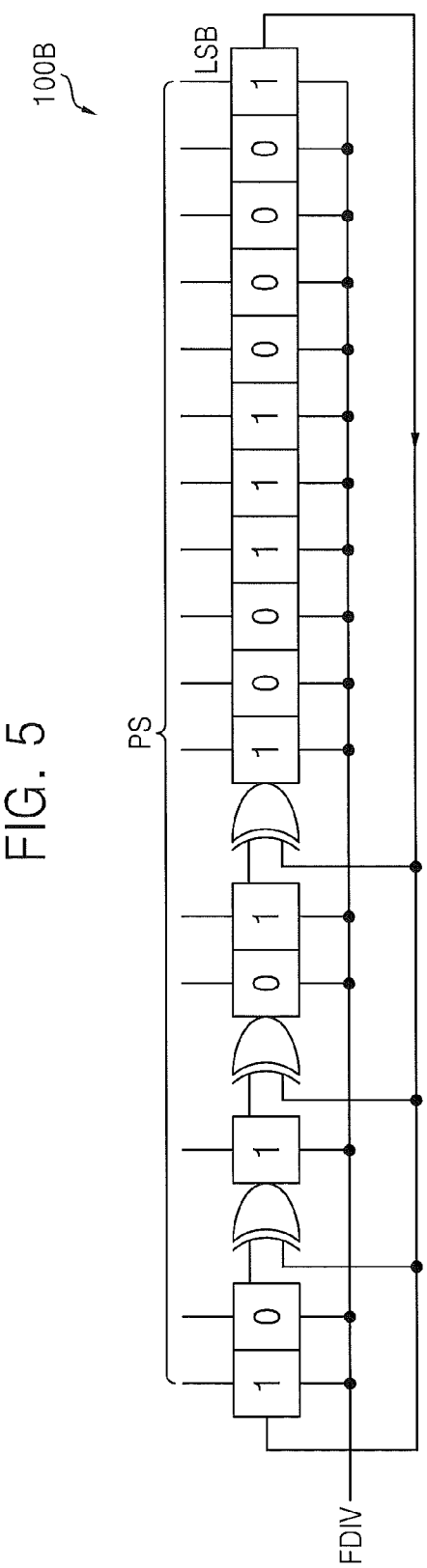
FIG. 5 illustrates another embodiment of the LFSR illustrated in FIG. 3.

FIG. 3 is a block diagram of the PRNG 21 illustrated in FIG. 1, FIG. 4 illustrates a 16-bit Fibonacci linear feedback shift register (LFSR) 100A which is an embodiment of an LFSR 100 illustrated in FIG. 3, and FIG. 5 illustrates a 16-bit Galois LFSR 100B which another embodiment of the LFSR 100 illustrated in FIG. 3.

Referring to FIG. 3, the PRNG 21 includes the LFSR 100 and a bit inversion control circuit 110. The LFSR 100 generates a pseudo random number sequence PS by using a seed value (or seed) SEED and the frequency-divided clock signal FDIV. The LFSR 100 may be implemented using the 16-bit Fibonacci LFSR 100A illustrated in FIG. 4 or the 16-bit Galois LFSR 100B illustrated in FIG. 5. Since the LFSRs 100A and 100B of FIGS. 4 and 5 are only embodiments for convenience of explanation, the LFSR 100 may be implemented using a T (T is a natural number)-bit Fibonacci LFSR or a T-bit Galois LFSR.

The bit inversion control circuit 110 may invert the output bit CB of the PRNG 21 at every period of the LFSR 100. In other words, the bit inversion control circuit 110 may equally adjust the numbers of first logics (for example, logic '1') and second logics (for example, logic '−1') of the output bit CB of the PRNG 21 every two periods of the LFSR 100. Accordingly, the pseudo random number sequence PS generated by the PRNG 21 may have a period twice greater than the period of a conventional PRNG, and thus the randomness of the PRNG 21 may further increase.

Although an embodiment in which a least significant bit (LSB) of the pseudo random number sequence PS is inverted at an every period of the LFSR 100 is illustrated in FIG. 3 for convenience of explanation, the position of a bit to be inverted and/or the number of bits to be inverted are not limited thereto. In other words, the bit inversion control circuit 110 may periodically invert the at least one output bit CB of the pseudo random number sequence PS generated by the LFSR 100. The bit inversion control circuit 110 includes a comparator 120, a selection signal generation circuit 130, an inverter 140, and a selection circuit 150.

Although FIG. 3 illustrates a single inverter 140 for inverting a single bit and a 2-input 1-output selection circuit 150, the numbers of inverters 140 and selection circuits 150 may vary according to the number of output bits CB of the pseudo random number sequence PS.

The comparator 120 may compare the seed value SEED with the pseudo random number sequence PS output from the LFSR 100 in units of bits and generate a comparison signal CP that has a different logic based on a result of the comparison. The seed value SEED may be a seed or an initial value of the LFSR 100. The selection signal generation circuit 130 may output a selection signal SEL in response to the comparison signal CP. According to an embodiment, the selection signal generation circuit 130 may be implemented using a D flip flop 131. The D flip flop 131 includes a clock terminal CK for receiving the comparison signal CP, an inversion output terminal QB connected to an input terminal D, and an output terminal Q for outputting the selection signal SEL. For example, it is assumed that, when the seed value SEED and the pseudo random number sequence PS are identical to each other, the comparator 120 outputs logic 1, and otherwise, the comparator 120 outputs logic 0 and the initial value of the D flip flop 131 is logic 1.

Until the pseudo random number sequence PS output from the LFSR 100 in response to the frequency-divided clock signal FDIV is made the same as the seed value SEED, the selection circuit 150 outputs, as the output bit CB, the LSB of the pseudo random number sequence PS received via a second input terminal T2 in response to the selection signal SEL having logic 1.

Since the comparator 120 outputs logic 1 when the seed value SEED and the pseudo random number sequence PS are identical to each other, the D flip flop 131 latches a signal of the inversion output terminal QB, namely, logic 0, in response to the logic 1 received via the clock terminal CK. Accordingly, the selection signal SEL output via the output terminal Q is changed from logic 1 to logic 0. In response to the selection signal SEL having logic 0, the selection circuit 150 outputs as the output bit CB an inverted LSB output from the inverter 140 received via a first input terminal T1.

As in the above-described example, the bit inversion control circuit 110 may output the LSB received via a second input terminal T2 as the output bit CB during one of an odd-numberth period and an even-numberth period of the LFSR 100. However, the bit inversion control circuit 110 may output the inverted LSB output from the inverter 140 as the output bit CB during the other period of the LFSR 100.

Accordingly, the number of first logics (for example, logic '1') and the number of second logics (for example, logic '−1') are identical to each other every two adjacent periods (or cycles) of the LFSR 100. In other words, the PRNG 21 may detect the period of the LFSR 100 and invert the output bit CB at an every detected period. For example, when the LFSR 100 is implemented using a T-bit Fibonacci LFSR or a T-bit Galois LFSR, the period of the LFSR 100 is $2^T-1$.

Figure 6:
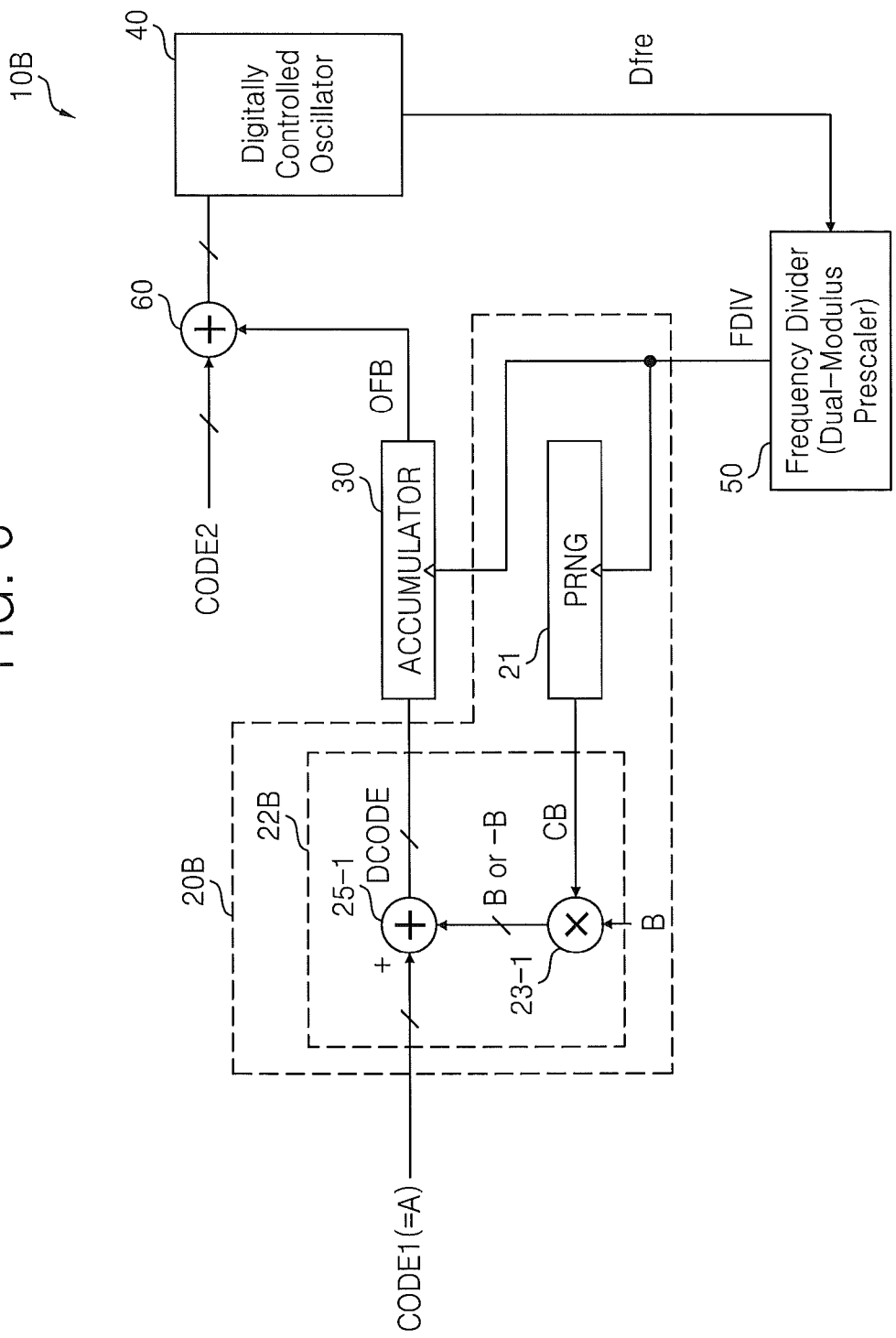
FIG. 6 is a block diagram of a clock signal generation circuit according to another embodiment of the present inventive concept.

FIG. 6 is a block diagram of a clock signal generation circuit 10B according to another embodiment of the present inventive concept. Referring to FIGS. 1 and 6, the structure and operation of the clock signal generation circuit 10B of FIG. 6 are substantially the same as those of the clock signal generation circuit 10A of FIG. 1, except for a dither circuit 22B of a dither control circuit 20B. The dither circuit 22B includes a conversion circuit 23-1 and an operation circuit 25-1. The conversion circuit 23-1 may output a coefficient digital code B or a coefficient digital code −B having a negative sign based on the coefficient digital code B and the output bit CB. Here, B or −B may be expressed as a decimal number. For example, when the output bit CB output from the PRNG 21 is one of logic 1 and logic −1, for example, logic 1, the conversion circuit 23-1 may output the coefficient digital code B. On the other hand, when the output bit CB output from the PRNG 21 is the other logic, for example, logic −1, the conversion circuit 23-1 may output the coefficient digital code of −B having a negative sign.

The operation circuit 25-1 may output a dithered digital code DCODE A+B or A−B) corresponding to a sum of the first digital code CODE1 (=A) and the coefficient digital code B or −B output from the conversion circuit 23-1, that is, A+B or A−B. For example, the operation circuit 25-1 may be implemented using an adder or a subtractor capable of outputting the sum of A+B or A−B.

Figure 7:
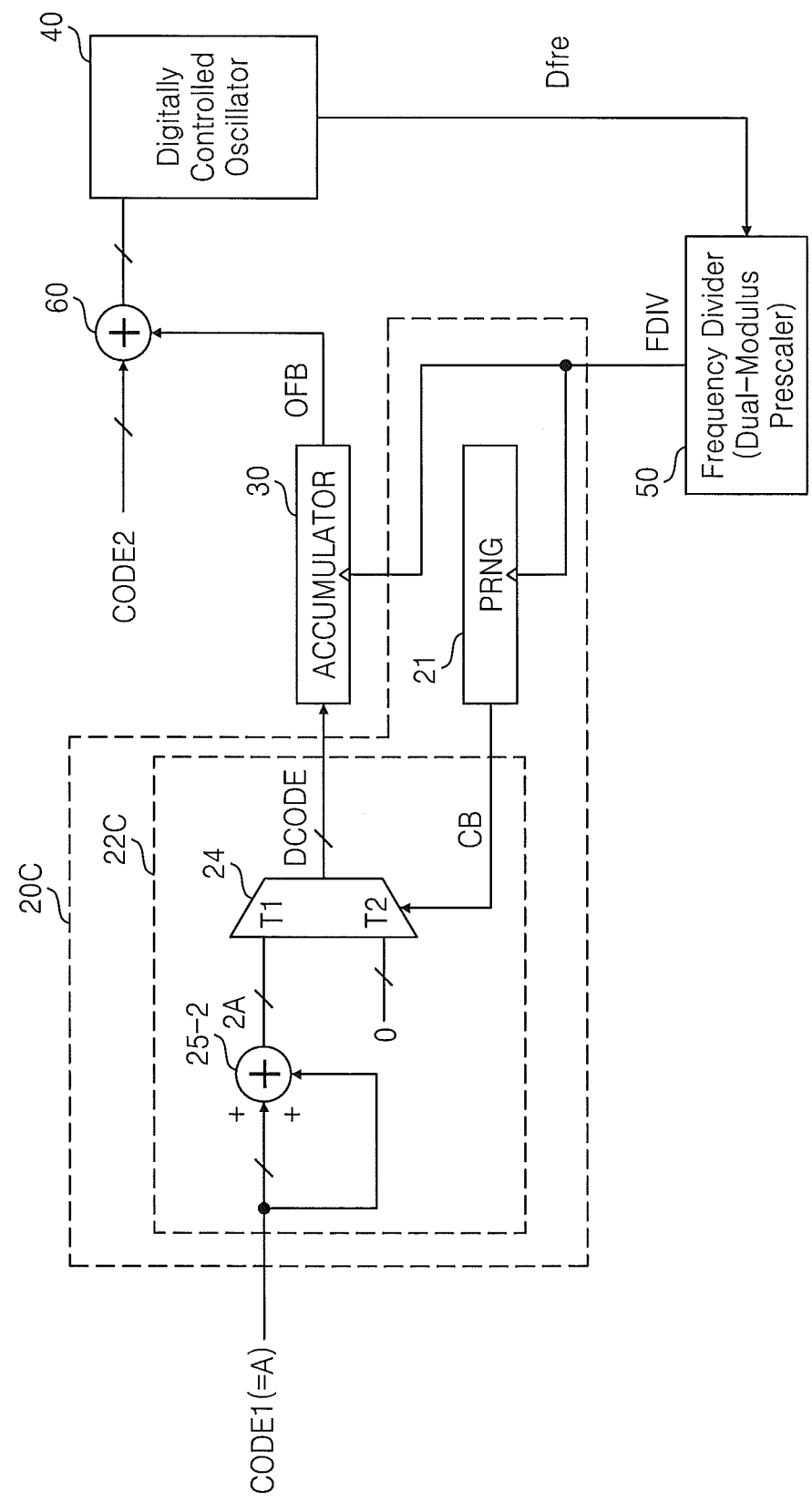
FIG. 7 is a block diagram of a clock signal generation circuit according to still another embodiment of the present inventive concept.

FIG. 7 is a block diagram of a clock signal generation circuit 10C according to still another embodiment of the present inventive concept. Referring to FIGS. 1 and 7, the structure and operation of the clock signal generation circuit 10C of FIG. 7 are substantially the same as those of the clock signal generation circuit 10A of FIG. 1, except for a dither circuit 22C of a dither control circuit 20C. The dither circuit 22C includes an adder 25-2 and a multiplexer 24. The adder 25-2 adds a first digital code CODE1 (=A) to a first digital code CODE1 (=A). For example, when A is expressed as a decimal number, the adder 25-2 may be replaced by a multiplier capable of outputting a value corresponding to (S*A). Here, S is a real number. The multiplexer 24 may output, as the dithered digital code DCODE, a digital code 2A output from the adder 25-2 and received via a first input terminal T1 or a digital code corresponding to '0' received via a second input terminal T2 to the accumulator 30, based on the output bit CB output from the PRNG 21.

Figure 8:
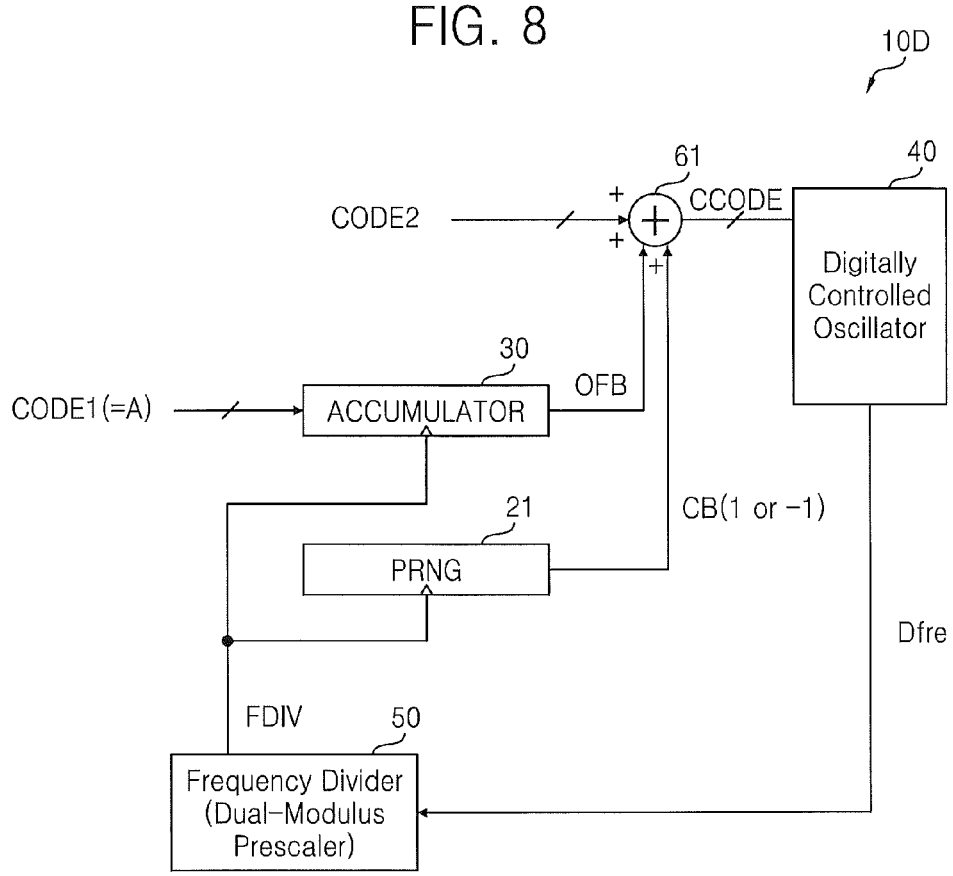
FIG. 8 is a block diagram of a clock signal generation circuit according to still another embodiment of the present inventive concept.

FIG. 8 is a block diagram of a clock signal generation circuit 10D according to still another embodiment of the present inventive concept. Referring to FIG. 8, the clock signal generation circuit 10D includes an accumulator 30, a DCO 40, and a frequency divider 50. In some cases, the clock signal generation circuit 10D may further include at least one of the PRNG 21 and an adder 61. As described above with reference to FIG. 2, the accumulator 30 may accumulate the first digital code CODE1 by using the frequency-divided clock signal FDIV and periodically output the overflow bit OFB according to a result of the accumulation. The DCO 40 may tune (or adjust) the frequency of the DOC output signal Dfre by using the second digital code CODE2 and the overflow bit OFB to generate the DOC output signal Dfre having the tuned (or adjusted) frequency. When the clock signal generation circuit 10D further includes the PRNG 21 and the adder 61, the DCO 40 may tune the frequency of the DOC output signal Dfre in response to a digital code CCODE output from the adder 61 to generate the DOC output signal Dfre having the tuned frequency. The frequency divider 50 may divide the frequency of the DOC output signal Dfre by a frequency division factor to generate a frequency-divided clock signal FDIV having a divided frequency. As described above, the frequency divider 50 may be implemented using a dual-modulus prescaler.

For example, as described above with reference to FIG. 2, when the first digital code CODE1 is '010000', the second digital code CODE2 is '00001000', the frequency resolution of the DCO 40 is 3 Mhz, overflow bits OFB sequentially output every four cycles of the frequency-divided clock signal FDIV are 0, 0, 0, and 1, and output bits CB sequentially output from the PRNG 21 are 1, 1, −1, and −1, digital codes CCODE sequentially output from the adder 61 are '00001001', '00001001', '00000111', and '00001000'. Accordingly, since frequencies of the DOC output signal Dfre sequentially output every four cycles of the frequency-divided clock signal FDIV are 27 Mhz (=9*3), 27 Mhz (=9*3), 21 Mhz (=7*3), and 24 Mhz (=8*3). Accordingly, a 4-period average frequency is 24.75 (=(27+27+21+24)/4) Mhz.

Figure 9:
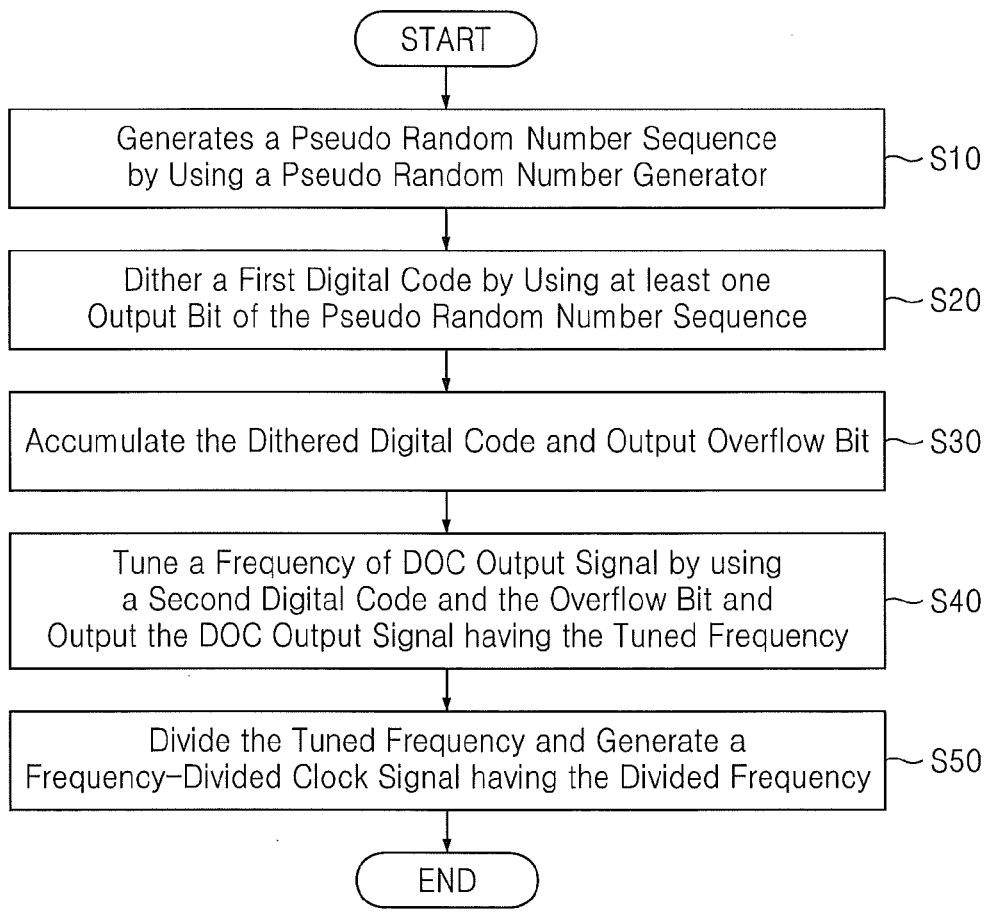
FIG. 9 is a flowchart of an operation of the clock signal generation circuit illustrated in FIG. 1, 6, or 7.

FIG. 9 is a flowchart of an operation of the clock signal generation circuit 10A, 10B, or 10C of FIG. 1, 6, or 7. Referring to FIGS. 1, 3, 6, 7, and 9, the PRNG 21, which is capable of inverting the output bit CB at every period (or cycle) of the LFSR 100, generates the pseudo random number sequence PS by using the seed value SEED and the frequency-divided clock signal FDIV (operation S 10).

The dither circuit 22A, 22B, or 22C (collectively referred to as a dither circuit 22), may convert (or dither) the first digital code CODE1 by using the at least one output bit CB of the pseudo random number sequence PS and output the converted (or dithered) digital code DCODE (operation S20). The accumulator 30 accumulates the dithered digital code DCODE by using the frequency-divided clock signal FDIV and periodically outputs the overflow bit OFB according to a result of the accumulation (operation S30).

The DCO 40 tunes the frequency of the DOC output signal Dfre by using the second digital code CODE2 and the overflow bit OFB and outputs the DOC output signal Dfre having the tuned frequency to the PRNG 21 and the accumulator 30 (operation S40). The frequency divider 50 divides the tuned frequency by a frequency division factor to generate the frequency-divided clock signal FDIV having a divided frequency (operation S50).

Figure 10:
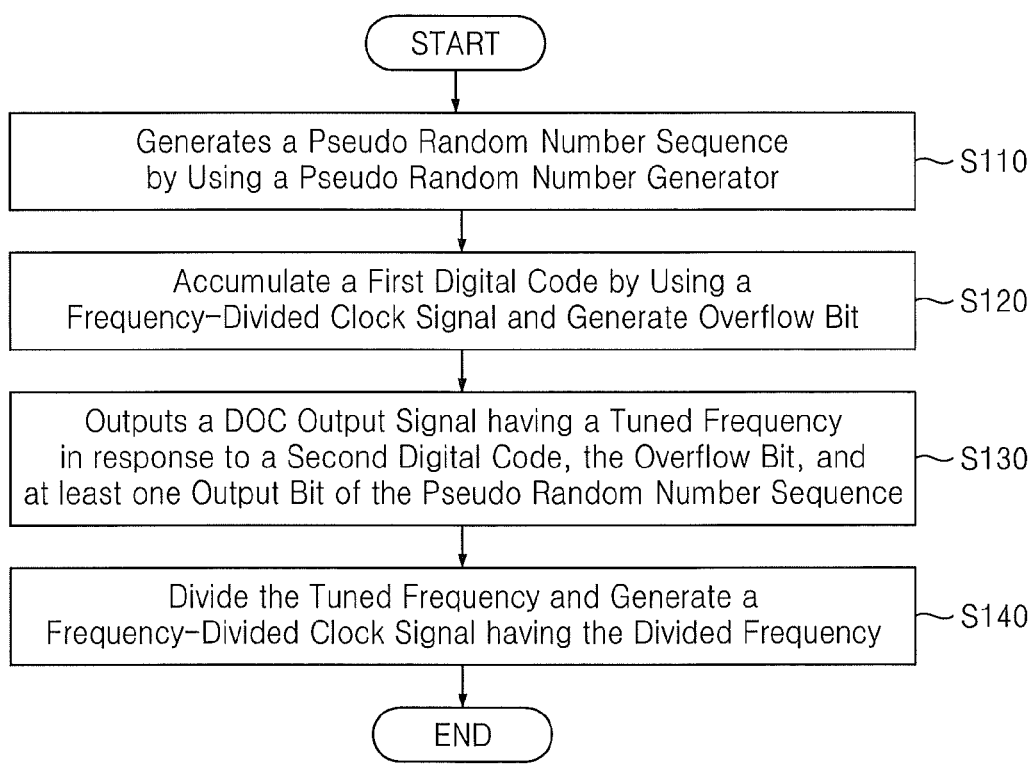
FIG. 10 is a flowchart of an operation of the clock signal generation circuit illustrated in FIG. 8.

FIG. 10 is a flowchart of an operation of the clock signal generation circuit 10D of FIG. 8. Referring to FIGS. 3, 8, and 10, the PRNG 21 generates the pseudo random number sequence PS by using the seed value SEED and the frequency-divided clock signal FDIV (operation S110). The accumulator 30 accumulates the first digital code CODE1 by using the frequency-divided clock signal FDIV and periodically outputs the overflow bit OFB according to a result of the accumulation (operation S120). The DCO 40 outputs the DOC output signal Dfre having the tuned frequency in response to the second digital code CODE2, the overflow bit OFB, and the at least one output bit CB of the pseudo random number sequence PS (operation S130). As described above, the second digital code CODE2 and the overflow bit OFB may be transmitted directly to the DCO 40 or transmitted to the DCO 40 via the adder 61.

The frequency divider 50 divides the tuned frequency by a frequency division factor to generate the frequency-divided clock signal FDIV having a divided frequency (operation S140). Each of the clock signal generation circuits 10A, 10B, 10C, and 10D (collectively referred to as a clock signal generation circuit 10) may be implemented as a part of a phase locked loop (PLL), a digital PLL (DPLL), an all digital PLL (ADPLL), a frequency synthesizer, an analog-to-digital converter (ADC), a digital-to-analog converter (DAC), or an oscillator.

Figure 11:
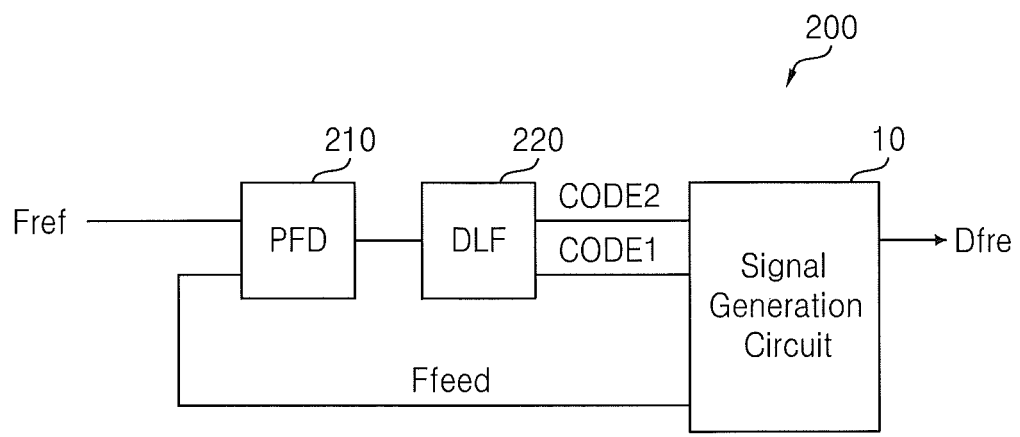
FIG. 11 is a block diagram of a phase locked loop (PLL) including the clock signal generation circuit illustrated in FIG. 1, 6, 7, or 8.

FIG. 11 is a block diagram of a PLL 200 including the clock signal generation circuit 10 of FIG. 1, 6, 7, or 8. The PLL 200 includes the clock signal generation circuit 10, a phase frequency detector 210, and a digital loop filter 220. The clock signal generation circuit 10 may be implemented using an integrated circuit (IC). The phase frequency detector 210 may compare a reference signal Fref with a feedback signal Ffeed fed back from the clock signal generation circuit 10 and generate a frequency/phase error signal according to a result of the comparison. For example, the phase frequency detector 210 may compare the phase and frequency of the reference signal Fref with those of the feedback signal Ffeed and generate the frequency/phase error signal according to the result of the comparison. According to an embodiment, the feedback signal Ffeed may be a signal that is the same as or different from the frequency-divided clock signal FDIV. In other words, the phase and frequency of the feedback signal Ffeed may be the same as or different from those of the frequency-divided clock signal FDIV. The digital loop filter 220 may filter the frequency/phase error signal to generate the first and second digital codes CODE1 and CODE2 capable of tuning the frequency of the DOC output signal Dref of the DCO 40.

Figure 12:
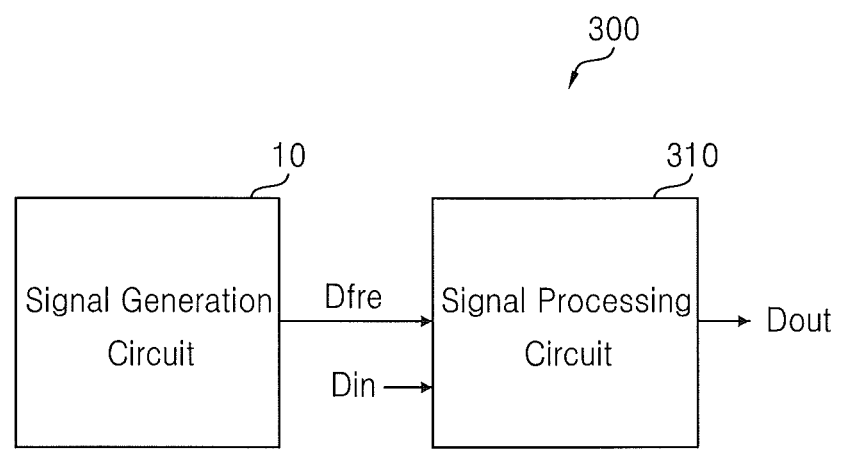
FIG. 12 is a block diagram of a signal processing device including the clock signal generation circuit illustrated in FIG. 1, 6, 7, or 8, according to an embodiment of the present inventive concept.

FIG. 12 is a block diagram of a signal processing device 300 including the clock signal generation circuit 10 of FIG. 1, 6, 7, or 8, according to an embodiment of the present inventive concept. The signal processing device 300 includes the clock signal generation circuit 10 and a signal processing circuit 310. The signal processing circuit 310 may be implemented using an analog or digital circuit that is capable of processing an input signal Din in response to the DOC output signal Dfre generated by the clock signal generation circuit 10 and outputting an output signal Dout according to a result of the processing. Accordingly, the signal processing circuit 310 may be implemented using a processor, a central processing unit (CPU), a transmitting and receiving circuit, or a communication circuit for processing digital data.

Figure 13:
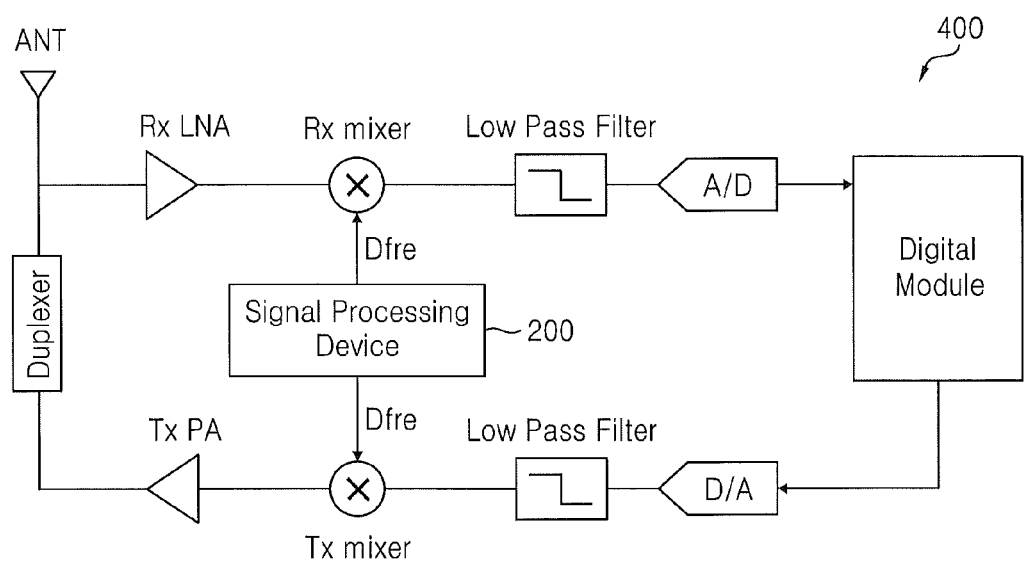
FIG. 13 is a block diagram of a signal processing device including the clock signal generation circuit illustrated in FIG. 1, 6, 7, or 8, according to another embodiment of the present inventive concept.

FIG. 13 is a block diagram of a signal processing device 400 including the clock signal generation circuit 10 of FIG. 1, 6, 7, or 8, according to another embodiment of the present inventive concept. The signal processing device 400 is capable of transmitting and receiving a wireless signal and includes a signal processing device 200 such as the PLL 200. According to an embodiment, the signal processing device 200 may be replaced by the clock signal generation circuit 10 which generates the DOC output signal Dfre. The DOC output signal Dfre generated by the clock signal generation circuit 10 or the DOC output signal Dfre generated by the signal processing device 200 is provided to a receiving (Rx) mixer and a transmitting (Tx) mixer.

A reception signal received via an antenna ANT is amplified by a Rx low noise amplifier (LNA), the Rx mixer mixes an amplified signal corresponding to a result of the amplification with the DOC output signal Dfre output from the signal processing device 200, and a mixed signal corresponding to a result of the mixing is transmitted to an analog-to-digital converter (ADC) via a low pass filter. A digital signal output from the ADC is processed in a digital module.

The digital signal output from the digital module is converted into an analog signal by a digital-to-analog converter (DAC), and the converted analog signal is transmitted to the Tx mixer via a low pass filter. The Tx mixer mixes an output signal of the low pass filter with the DOC output signal Dfre output from the signal processing device 200, and the mixed signal corresponding to a result of the mixing is transmitted to the antenna ANT via a Tx power amplifier (PA) and a duplexer.

Figure 14:
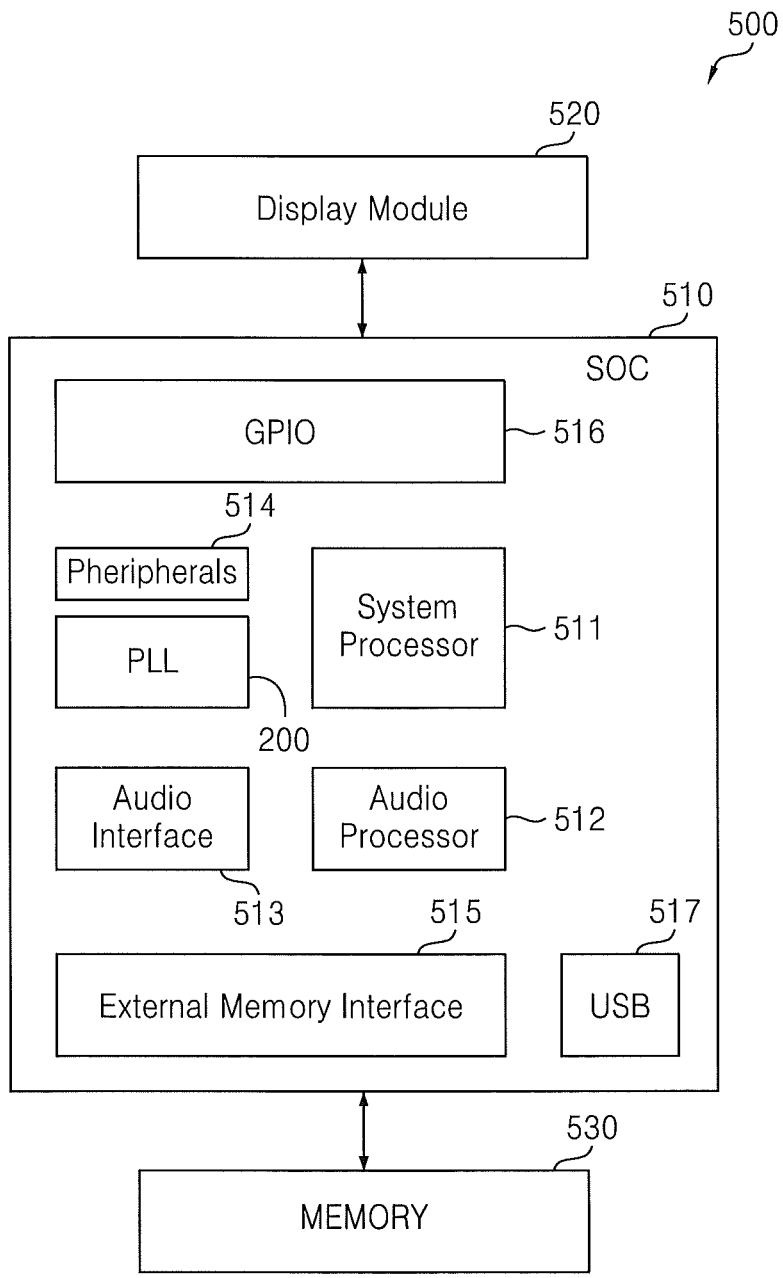
FIG. 14 is a block diagram of a signal processing device including the clock signal generation circuit illustrated in FIG. 1, 6, 7, or 8, according to still another embodiment of the present inventive concept.

FIG. 14 is a block diagram of a signal processing device 500 including the clock signal generation circuit 10 of FIG. 1, 6, 7, or 8, according to still another embodiment of the present inventive concept. The signal processing device 500 includes a system on chip (SoC) 510, a display module 520, and a memory 530.

The data processing device 500 may be implemented using a personal computer (PC) or a portable device. The portable device may be implemented using a handheld device such as a laptop computer, a mobile telephone, a smart phone, a tablet PC, a personal digital assistant (PDA), an enterprise digital assistant (EDA), a digital still camera, a digital video camera, a portable multimedia player (PMP), a personal or portable navigation device (PND), a handheld game console, or an e-book.

The PLL 200 implemented in the SOC 510 may provide a DCO output signal to at least one of a system processor 511, an audio processor 512, an audio interface 513, a peripheral circuit 514, an external memory interface 515, a general purpose input/output (GPIO) 516, and a universal serial bus (USB) 517.

The display module 520 may display a signal output from the SOC 510, for example, a signal processed by a system processor used as a signal processing circuit. The display module 520 includes a display capable of displaying the signal and a control circuit capable of controlling an operation of the display. The memory 530 stores data which is to be processed or has been processed by the SOC 510.

Although the dither control circuit 20A, 20B, or 20C may be used in various circuits, for example, an ADC, a DAC, a sigma-delta modulator, a PLL, a DPLL, and a circuit required to remove spurious (or spurious components), a case where the dither control circuit 20A, 20B, or 20C is used in the clock signal generation circuit 10A, 10B, or 10C is illustrated herein for convenience of explanation.

A dither control circuit according to an embodiment of the present inventive concept may dither an input digital code based on an output signal of a PRNG. A clock signal generation device according to an embodiment of the present inventive concept may increase the frequency resolution of a DCO by using an output signal of an accumulator.

In addition, the clock signal generation circuit may remove or reduce spurious components that are generated according to a periodic operation of the accumulator by using at least one bit of a pseudo random number sequence generated by a PRNG.

Since the output signal of the accumulator and/or the PRNG of the clock signal generation circuit is generated based on an output signal of a dual-modulus prescaler, the output signal of the accumulator and/or the PRNG may be randomized.

The clock signal generation circuit may be implemented in a small area because it does not include a high-order sigma delta modulation circuit. The phase noise property and jitter performance of the clock signal generation circuit are improved.

While the present inventive concept has been particularly shown and described with reference to exemplary embodiments thereof, it will be understood that various changes in form and details may be made therein without departing from the spirit and scope of the following claims.

What is claimed is:

1. An integrated circuit device, comprising:
   a pseudo random number generator configured to generate a pseudo random number sequence in response to a clock signal; and
   a dither circuit configured to dither an input digital code in response to at least one output bit in the pseudo random number sequence and further configured to output a digital code as a sum of or a difference between the input digital code and the dithered input digital code.

2. The device of claim 1, wherein said pseudo random number generator comprises:
   a linear feedback shift register configured to generate the pseudo random number sequence in response to the clock signal; and
   a bit inversion control circuit that inverts and outputs the at least one output bit at a period of the linear feedback shift register.

3. The device of claim 1, wherein said pseudo random number generator comprises:
   a linear feedback shift register configured to generate the pseudo random number sequence in response to the clock signal; and a bit inversion control circuit that inverts and outputs a single bit at a period of the linear feedback shift register when the at least one output bit is the single bit.

4. An integrated circuit device, comprising:
a pseudo random number generator configured to generate a pseudo random number sequence in response to a clock signal; and
a dither circuit configured to dither an input digital code in response to at least one output bit in the pseudo random number sequence and further configured to output a digital code responsive to the dithered input digital code;
wherein said pseudo random number generator comprises:
a linear feedback shift register configured to generate the pseudo random number sequence in response to the clock signal; and
a bit inversion control circuit that inverts and outputs a single bit at a period of the linear feedback shift register when the at least one output bit is the single bit;
wherein said bit inversion control circuit comprises:
a comparator that generates a comparison signal in response to comparing a seed and the pseudo random number sequence of the linear feedback shift register in units of bits;
a selection signal generation circuit that outputs a selection signal in response to the comparison signal;
an inverter that inverts the single bit; and
a selection circuit that outputs the single bit or an inverted bit generated by the inverter as the output bit in response to the selection signal.

5. A clock signal generation circuit, comprising:
a control circuit configured to generate a dithered digital code in response to dithering a first digital code using a clock signal;
an accumulator configured to output an overflow bit in response to accumulating the dithered digital code in-sync with the clock signal;
a digitally controlled oscillator (DCO) configured to generate a DCO output signal having a tuned frequency in response to a second digital code and the overflow bit; and
a frequency divider configured to divide the tuned frequency of the DCO output signal and output the clock signal.

6. The circuit of claim 5, wherein said control circuit comprises:
a pseudo random number generator configured to generate a pseudo random number sequence in response to the clock signal; and
a dither circuit configured to generate a dithered digital code by dithering the first digital code using at least one output bit of the pseudo random number sequence.

7. The circuit of claim 6, wherein said dither circuit outputs, as the dithered digital code, a digital code corresponding to a sum of or a difference between the first digital code and the first digital code according to the at least one output bit.

8. The circuit of claim 6, wherein said pseudo random number generator comprises:

a linear feedback shift register (LFSR) that generates the pseudo random number sequence in response to the frequency-divided clock signal; and
a bit inversion control circuit that inverts and outputs the at least one output bit per period of the LFSR.

9. The circuit of claim 6, wherein said dither circuit comprises:
a conversion circuit configured to output the first digital code or a first digital code having a negative sign in response to the first digital code and the at least one output bit; and
an operation circuit configured to output the dithered digital code corresponding to a sum of the first digital code and an output digital code output from the conversion circuit.

10. The circuit of claim 6, wherein said dither circuit comprises:
a conversion circuit configured to output a coefficient digital code or a coefficient digital code having a negative sign in response to the coefficient digital code and the at least one output bit; and
an operation circuit configured to output the dithered digital code corresponding to a sum of the first digital code and an output digital code output from the conversion circuit.

11. The circuit of claim 5, wherein said frequency divider is a dual modulus prescaler that divides the tuned frequency by a first or second frequency division factor and generates the clock signal having a divided frequency.

12. A clock signal generation circuit comprising:
an accumulator which accumulates a first digital code by using a frequency-divide clock signal and outputs an overflow bit;
a pseudo random number generator which generates a pseudo random number sequence by using the frequency-divided clock signal;
a digitally controlled oscillator (DCO) which generates a DCO output signal having a tuned frequency based on at least one output bit of the pseudo random number sequence, a second digital code, and the overflow bit; and
a frequency divider which divides the tuned frequency and generates the frequency-divided clock signal having a divided frequency.

13. The circuit of claim 12, wherein the pseudo random number generator includes:
a linear feedback shift register (LFSR) which generates the pseudo random number sequence in response to the frequency-divided clock signal; and
a bit inversion control circuit which inverts and outputs the at least one output bit per period of the LFSR.

14. The circuit of claim 12, wherein the frequency divider is a dual-modulus prescaler that divides the tuned frequency by a first or second frequency division factor and generates the frequency-divided clock signal having a divided frequency.

* * * * *